US012224551B2

(12) United States Patent
Danziger et al.

(10) Patent No.: US 12,224,551 B2
(45) Date of Patent: Feb. 11, 2025

(54) LASER PACKAGE AND PROJECTOR WITH THE LASER PACKAGE

(71) Applicants: OSRAM Opto Semiconductors GmbH, Regensburg (DE); LUMUS LTD., Ness Ziona (IL)

(72) Inventors: Yochay Danziger, Kfar Vradim (IL); Ann Russell, San Jose, CA (US)

(73) Assignees: OSRAM OPTO SEMICONDUCTORS GMBH, Regensburg (DE); LUMUS LTD., Ness Ziona (IL)

( * ) Notice: Subject to any disclaimer, the term of this patent is extended or adjusted under 35 U.S.C. 154(b) by 609 days.

(21) Appl. No.: 17/444,082

(22) Filed: Jul. 30, 2021

(65) Prior Publication Data

US 2022/0190552 A1    Jun. 16, 2022

Related U.S. Application Data

(60) Provisional application No. 63/210,554, filed on Jun. 15, 2021, provisional application No. 63/160,820, filed on Mar. 14, 2021, provisional application No. 63/123,518, filed on Dec. 10, 2020.

(51) Int. Cl.
| | |
|---|---|
| *H01S 5/02253* | (2021.01) |
| *H01S 5/02255* | (2021.01) |
| *H01S 5/40* | (2006.01) |
| *G03B 21/20* | (2006.01) |

(52) U.S. Cl.
CPC ...... *H01S 5/02253* (2021.01); *H01S 5/02255* (2021.01); *H01S 5/4031* (2013.01); *H01S 5/4093* (2013.01); *G03B 21/2033* (2013.01)

(58) Field of Classification Search
CPC ...... H01S 5/0225–02257; H01S 5/4012–4093; H01S 5/023–02315
See application file for complete search history.

(56) References Cited

U.S. PATENT DOCUMENTS

| | | | |
|---|---|---|---|
| 6,404,542 | B1 | 6/2002 | Ziari et al. |
| 6,773,142 | B2 * | 8/2004 | Rekow ............... G02B 27/09 |
| | | | 235/462.35 |
| 7,206,479 | B2 | 4/2007 | Wu et al. |

(Continued)

FOREIGN PATENT DOCUMENTS

| | | | |
|---|---|---|---|
| CN | 111007663 A | 4/2020 | |
| DE | 102012103257 A1 * | 10/2013 | ......... H01S 5/02216 |

(Continued)

OTHER PUBLICATIONS

JP2019160624 (translation) (Year: 2019).*

(Continued)

*Primary Examiner* — Tod T Van Roy
*Assistant Examiner* — Delma R Forde
(74) *Attorney, Agent, or Firm* — MH2 Technology Law Group LLP

(57) ABSTRACT

A laser device comprises a plurality of laser diodes, each laser diode emitting a light beam having a fast axis and a slow axis and a beam direction; and one or more optical components configured to modify a divergence of the light beams in a fast axis plane and/or in a slow axis plane such that the light beams have a same focal plane in the fast axis plane and in the slow axis plane.

19 Claims, 12 Drawing Sheets

(56) References Cited

U.S. PATENT DOCUMENTS

| | | | |
|---|---|---|---|
| 8,488,245 | B1 | 7/2013 | Chann et al. |
| 8,665,178 | B1 | 3/2014 | Wang |
| 8,724,222 | B2 | 5/2014 | Chann et al. |
| 10,014,657 | B2* | 7/2018 | Miller .................. G02B 3/0012 |
| 10,177,872 | B1 | 1/2019 | Wang et al. |
| 11,515,689 | B2* | 11/2022 | Katagiri ............. H01S 5/02325 |
| 2002/0105981 | A1* | 8/2002 | Gen-ei .................... G11B 7/127 |
| 2003/0043364 | A1 | 3/2003 | Jamieson et al. |
| 2003/0053507 | A1 | 3/2003 | Islam et al. |
| 2004/0109329 | A1 | 6/2004 | Kato |
| 2008/0019010 | A1 | 1/2008 | Govorkov et al. |
| 2008/0101429 | A1 | 5/2008 | Sipes |
| 2008/0204842 | A1 | 8/2008 | Arai et al. |
| 2009/0219960 | A1 | 9/2009 | Uberna et al. |
| 2010/0020291 | A1 | 1/2010 | Kasazumi et al. |
| 2010/0033508 | A1 | 2/2010 | Mizushima et al. |
| 2013/0010265 | A1 | 1/2013 | Curtis |
| 2013/0140429 | A1 | 6/2013 | Schneider |
| 2013/0272329 | A1 | 10/2013 | Auen et al. |
| 2014/0049610 | A1 | 2/2014 | Hudman et al. |
| 2015/0288937 | A1 | 10/2015 | Tsai et al. |
| 2017/0125976 | A1 | 5/2017 | Sato |
| 2018/0198258 | A1 | 7/2018 | Chen et al. |
| 2019/0056600 | A1 | 2/2019 | Danziger et al. |
| 2019/0334321 | A1 | 10/2019 | Aruga |
| 2022/0123527 | A1* | 4/2022 | Danziger .............. H01S 5/0071 |
| 2022/0360039 | A1* | 11/2022 | Russell ................ H01S 5/4056 |

FOREIGN PATENT DOCUMENTS

| | | |
|---|---|---|
| DE | 202017105001 U1 | 9/2017 |
| EP | 1182481 A2 | 2/2002 |
| EP | 1882972 A2 | 1/2008 |
| JP | 2019160624 A1 | 9/2019 |
| WO | 9413045 A1 | 6/1994 |
| WO | 2005059626 A1 | 6/2005 |
| WO | 2017032947 A1 | 3/2017 |
| WO | 2017141242 A2 | 8/2017 |
| WO | 2018118645 A1 | 6/2018 |
| WO | 2019077601 A1 | 4/2019 |
| WO | 2019102366 A1 | 5/2019 |
| WO | 2019220430 A2 | 11/2019 |
| WO | 2020018160 A1 | 1/2020 |
| WO | 2021044409 A1 | 3/2021 |
| WO | 2021053661 A1 | 3/2021 |

OTHER PUBLICATIONS

Mukawa et al., "A full-color eyewear display using planar waveguides with reflection volume holograms", Journal of the SID, 2009, vol. 17, No. 3, pp. 185-193.

International Search Report and Written Opinion in corresponding International Application No. PCT/EP2021/078056 mailed on Jun. 21, 2022, 27 pages.

International Search Report and Written Opinion in corresponding International Application No. PCT/EP2021/078044 mailed on Jan. 20, 2022, 15 pages.

Non-Final Office Action issued Dec. 19, 2024 in related U.S. Appl. No. 17/444,079, filed Jul. 30, 2021, 15 pages.

* cited by examiner

FIG 4A
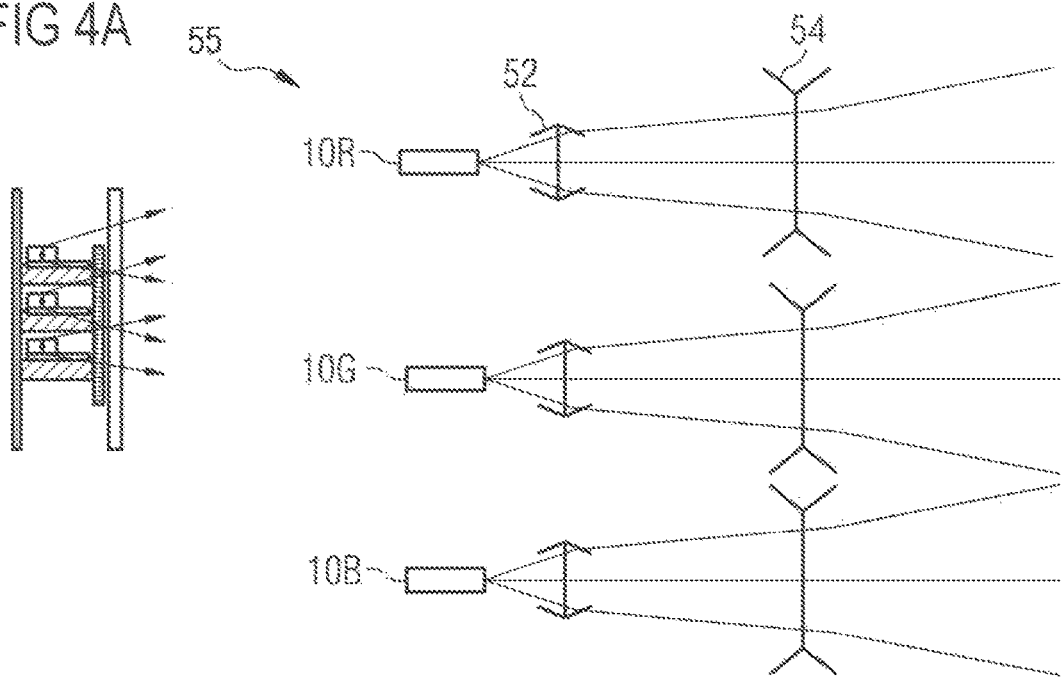
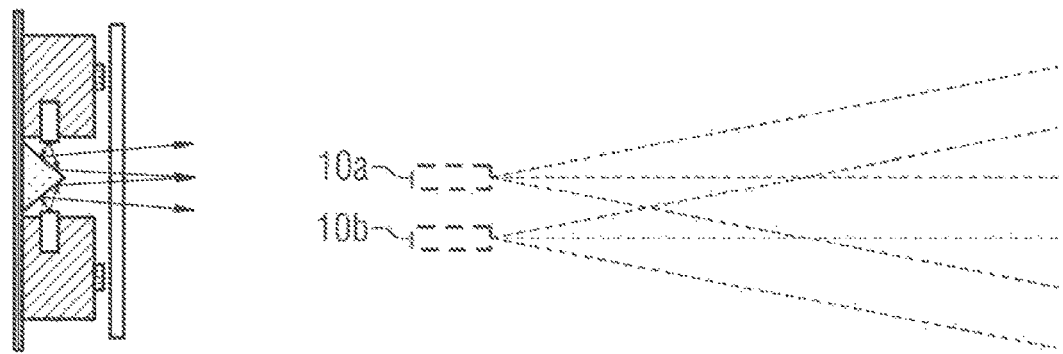
FIG 4B
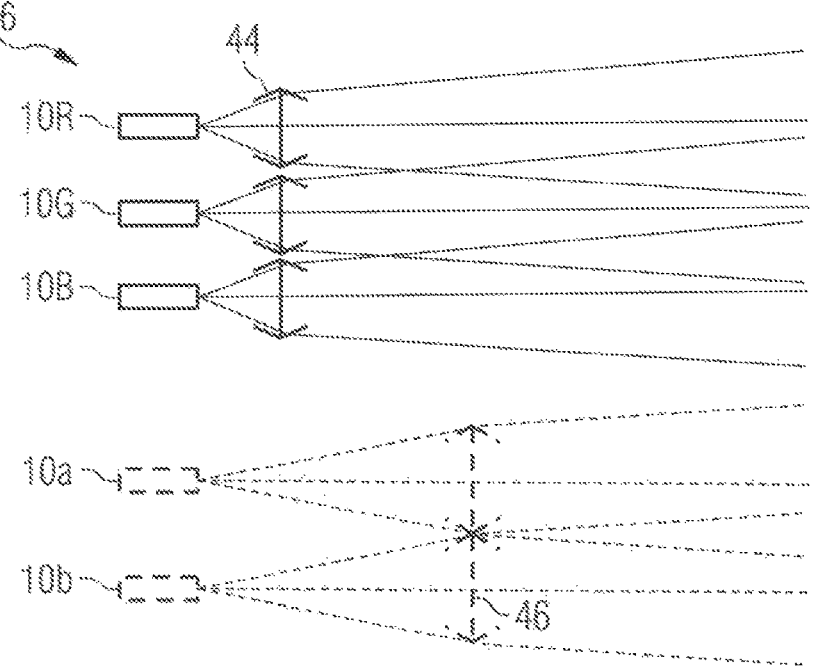

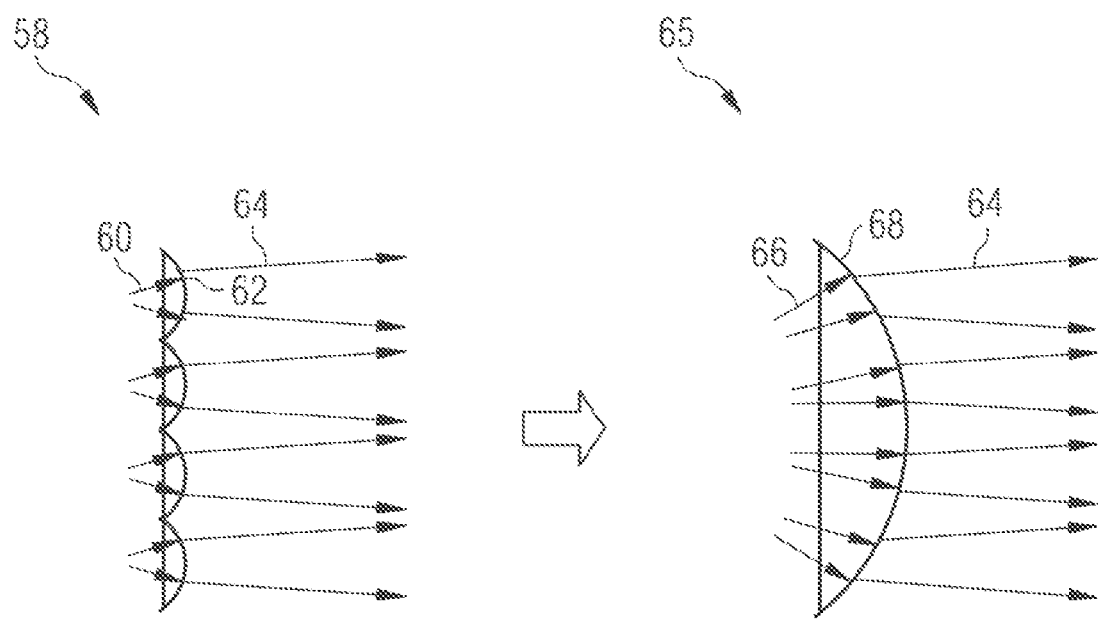

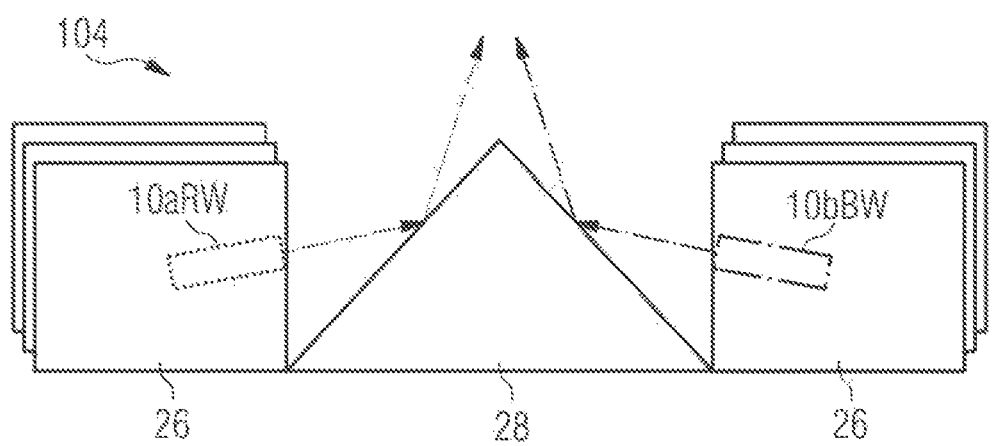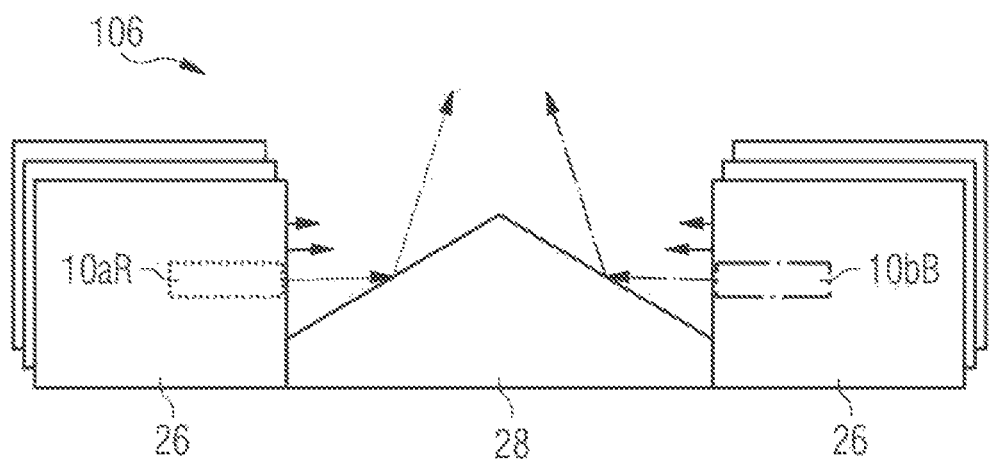

LASER PACKAGE AND PROJECTOR WITH THE LASER PACKAGE

CROSS-REFERENCE TO RELATED APPLICATIONS

The present application claims priority to, and the benefit of, U.S. Provisional Patent Application Nos. 63/123,518 filed on Dec. 10, 2020, 63/160,820 filed on Mar. 14, 2021, and 63/210,554 filed on Jun. 15, 2021, all of which are hereby incorporated by reference in their entirety.

BACKGROUND

This disclosure relates to a laser device, and specifically to systems and methods for matching the fast and slow axis field of views for the laser device. Furthermore, the disclosure relates to a projector with the laser device. The laser device is used as light source in the projector, which can be an image projector, for example for near-eye displays, such as augmented reality (AR) and virtual reality (VR) applications.

SUMMARY

According to at least one embodiment, a laser device comprises at least one set of at least one laser diode. The set of at least one laser diode can also be denoted as a laser diode set in the following. Preferably, the at least one laser diode set comprises at least two laser diodes. Preferably, a laser diode set comprises or is a set of two or more laser diodes that emit light with the same or substantially the same color. Accordingly, a laser diode set can be defined by an emission color, which can be defined by the sum of the light emitted by all laser diodes of the laser diode set. "The same or substantially the same color" can, for example, mean that a human observer, perceiving the respective light emitted from each of the laser diodes of a laser diode set, has the impression that all laser diodes of the laser diode set emit light with the same or substantially the same color. This can, for instance, mean that the laser diodes of a laser diode set emit light with the same or substantially the same color locus. According to certain embodiments, this can mean that the laser diodes of a laser diode set emit light with the same or similar or substantially similar spectral components.

According to a further embodiment, a projector comprises the laser device as described before. The features and embodiments described in the following in regard to the laser device equally apply to the projector.

According to a further embodiment, the laser device comprises at least two laser diode sets, wherein each laser diode set comprises at least one laser diode or, preferably, at least two laser diodes. Accordingly, the laser device can comprise a first laser diode set emitting a first color and a second laser diode set emitting a second color. The first color and the second color preferably differ from each other. This can, in particular, mean that the first color and the second color are perceived as different colors by a human observer. Furthermore, the laser device can comprise a first laser diode set emitting a first color, a second laser diode set emitting a second color and a third laser diode set emitting a third color. The first color and the second color and the third color preferably differ from each other. For example, the laser device can comprise a first laser diode set emitting light with a red color, a second laser diode set emitting a green color and a third laser diode set emitting a blue color. Accordingly, the laser device can be a so-called RGB laser device. Each laser diode set can form a so-called color channel of the laser device and can comprise one or more laser diodes.

When features and/or properties of "a laser diode set" or "a color channel" are described throughout the description, those features and/or properties apply to at least one laser diode set/color channel and, preferably, to all laser diode sets/color channels of the laser device.

According to a further embodiment, the laser diodes are attached to at least one submount. Correspondingly, the laser device can comprise at least one submount, wherein at least one or a plurality of laser diodes is/are attached to the submount. The at least one submount can have a mounting surface on which at least one laser diode is mounted. For example, each of the laser diodes of a plurality of laser diodes can be arranged on a respective assigned submount. Furthermore, it can be possible that the at least one submount has a first mounting surface, wherein at least one laser diode is arranged on the first mounting surface, and a second mounting surface opposite to the first mounting surface, wherein at least one further laser diode is arranged on the second mounting surface. Furthermore, the at least one submount can include one or more conductors, for example formed by connecting pads. Moreover, the laser device can comprise a plurality of such submounts, wherein one or more laser diodes is/are attached to each of the submounts, respectively. Accordingly, the laser device may be constructed using one or more so-called chip-on-submount assemblies (COSAs), in which one or more laser diodes are placed on a submount, and the laser device can include one or more submounts forming an array.

Preferably, the laser diodes can be part of a laser package. The laser device can comprise the laser package or can be formed by the laser package. The laser package can comprise a base, which can be a carrier for the components of the laser package and on which the laser diodes are arranged.

According to a further embodiment, the at least one submount is arranged on the base. The base can have a base surface, on which the at least one submount is arranged. Here and in the following, the base surface can define a plane that is denoted as a horizontal plane. In other words, the base surface defines a horizontal plane with respect to the laser device and, in particular, with respect to the laser package. However, in the projector the laser device and, in particular, the laser package can be arranged in any desired orientation with respect to the other components of the projector, so that the horizontal base surface can be arranged in a position that deviates from the horizontal plane that is defined, for instance, by gravity.

According to a further embodiment, the at least one submount is arranged vertically on the base. This can mean that the mounting surface of the submount or the first and second mounting surfaces of the submount as described above is/are not parallel to the base surface but are arranged vertically with respect to the horizontal base surface. In other words, the mounting surface(s) of the at least one submount is/are arranged perpendicularly or at least substantially perpendicularly to the base surface. Consequently, in the vertical arrangement of a submount on the base surface of the base a laser diode on the mounting surface can be positioned next to the submount along a direction that is parallel or at least substantially parallel to the base surface and, thus, parallel or at least substantially parallel to the horizontal plane of the laser device.

According to a further embodiment, the laser device comprises a plurality of laser diodes as explained before, wherein each laser diode emits, during operation, a light beam having a fast axis and a slow axis and a beam direction. The laser device preferably further comprises one or more optical components configured to modify a divergence of the light beams in a fast axis plane and/or in a slow axis plane. Particularly preferably, the divergence of the light beams is modified such that the light beams have a same focal plane in the fast axis plane and in the slow axis plane.

According to a further embodiment, the one or more optical components comprise at least one lens or lens array. Preferably, the one or more optical components comprise at least two lenses. Particularly preferably, each of the two lenses influences a beam divergence only in one plane chosen from the fast axis plane and the slow axis plane. For instance, one of the two lenses influences a beam divergence only in the fast axis plane, whereas the other of the two lenses influences a beam divergence only in the slow axis plane. Alternatively, each of the two lenses influences a beam divergence only in the fast axis plane or only in the slow axis plane. An optical component that influences a beam divergence only in one plane chosen from the fast axis plane and the slow axis plane can preferably be a single cylindrical lens or a lens array comprising a plurality of cylindrical microlenses. Particularly preferably, in case an optical component is formed by a single lens, the lens is assigned to at least two laser diodes or to more than two laser diodes or even to all laser diodes. Here and in the following, a lens is assigned to a laser diode if the light beam emitted by the laser diode is influenced and altered by that lens.

According to a further embodiment, the one or more optical components comprise at least one convergent optical component influencing a beam divergence only in the fast axis plane.

According to a further embodiment, the one or more optical components comprise a convergent lens assigned to at least two laser diodes or a convergent lens array.

According to a further embodiment, the one or more optical components comprise at least one divergent optical component influencing a beam divergence only in the slow axis plane.

According to a further embodiment, the one or more optical components comprise a divergent lens assigned to at least two laser diodes or a divergent lens array.

According to a further embodiment, the one or more optical components comprises two cylindrical lenses, wherein at least one of the cylindrical lenses is assigned to at least two laser diodes. In particular, one of the two cylindrical lenses is arranged downstream of the other of the tow cylindrical lenses. In preferred embodiments the lens that is assigned to at least two laser diodes is a single cylindrical lens that is assigned to all laser diodes of the laser device. The other of the two cylindrical lenses can also be a single lens or a lens array.

According to a further embodiment, the lens array comprises a plurality of convergent cylindrical microlenses arranged next to each other along a direction in the fast axis plane.

According to a further embodiment, the lens array comprises a plurality of divergent cylindrical microlenses arranged next to each other along a direction in the slow axis plane.

According to a further embodiment, each of the microlenses is assigned to at least one laser diode, wherein each of the microlenses has a cylinder axis that is perpendicular to the fast axis and parallel to the slow axis.

According to a further embodiment, at an output surface of the lens array, the light beam of at least one laser diode is tilted in the fast axis plane with respect to the light beam of another of the laser diodes at the output surface of the lens array and/or with respect to an optical axis of the assigned microlens.

According to a further embodiment, at least some of the laser diodes are tilted with respect to each other in the fast axis plane.

According to a further embodiment, at least one laser diode is arranged off-centered in the fast axis plane with respect to the optical axis of the assigned microlens.

According to a further embodiment, at least some of the laser diodes are tilted with respect to each other in the slow axis plane.

According to a further embodiment, the one or more optical components comprise a divergent optical component influencing only a beam divergence in the fast axis plane.

According to a further embodiment, the one or more optical components comprise a cylindrical lens assigned to all laser diodes, for instance a divergent cylindrical lens in combination with the above-mentioned convergent microlenses or a convergent cylindrical lens in combination with the above-mentioned divergent microlenses.

According to a further embodiment, one or more of the plurality of laser diodes are tilted at an angle from an axis of symmetry of the one or more optical components.

According to a further embodiment, the laser device further comprises a prism having two reflecting sides, onto which the laser diodes emit light, wherein on each side there are several faces that are tilted with respect to each other. Preferably, the prism is mounted on the base of the laser package.

According to a further embodiment, in the projector the light beams have an aperture in the fast axis plane and an aperture in the slow axis plane which overlap.

Further features, advantages and expediencies of the laser device will become apparent from the following description of exemplary embodiments and features in conjunction with the figures. The embodiments shown in the figures and, in particular, the respective described features are not limited to the respective combinations of features shown in the figures. Rather, the shown embodiments as well as single features can be combined with one another, even if not all combinations are explicitly described.

BRIEF DESCRIPTION OF THE FIGURES

FIGS. 4A and 4B illustrate examples of modifying the fast and slow axes of a six-laser device in accordance with further embodiments.

FIG. 5 illustrates a system and method for modifying the field of view of both the fast and slow axes of a laser device in accordance with further embodiments.

FIGS. 9A and 9B illustrate a further embodiment for the correction of differing divergences along the fast axis and the slow axis of a laser device using optics in accordance with various implementations.

DETAILED DESCRIPTION

Figure 1:
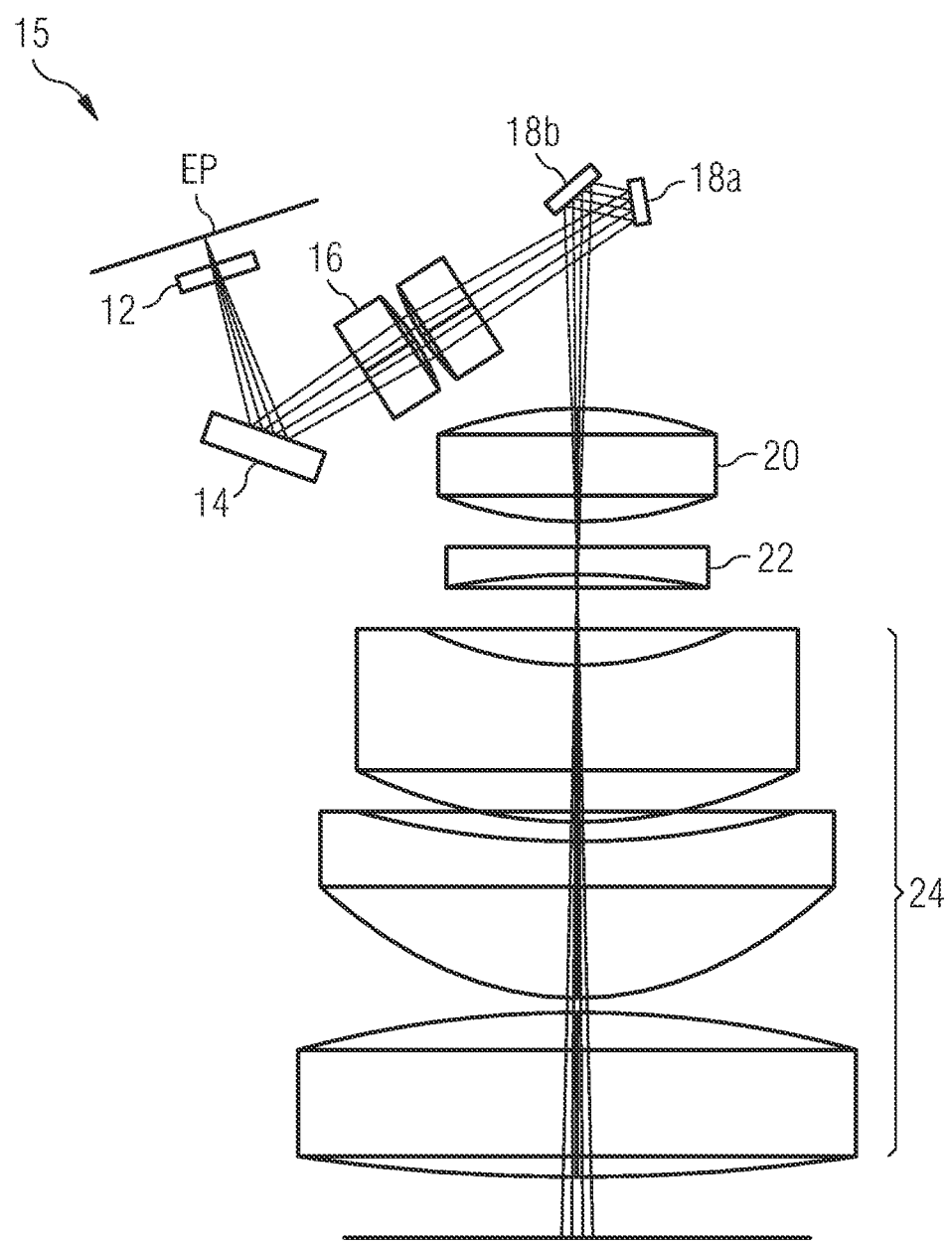
FIG. 1 illustrates a projector in accordance with various embodiments.

These and other features of the present implementations will be understood better by reading the following detailed description, taken together with the figures herein described. The accompanying drawings are not intended to be drawn to scale. For purposes of clarity, not every component may be labeled in every drawing.

In the following, various embodiments of a laser device and of a projector are described, wherein the laser device can be used in the projector as light source. The projector can be a display system in general and, in particular, a near-eye display system that is based on side-by-side scanning laser-beams. By way of example, even if not always explicitly shown, the laser device according to the depicted embodiments can comprise three laser diode sets, each having two laser diodes that are formed by edge-emitting diode lasers, respectively. Consequently, by way of example, six laser diodes can be used in a laser device according to the shown embodiments. However, other numbers of laser diode sets and laser diodes per laser diode set are also possible.

In the following, laser diodes are denoted with the reference numeral 10, to which, for example depending on the depicted view, further information can be added like, for instance, "a", "b", "R", "G", or "B". In this regard, for instance a plurality of laser diodes can be denoted as "laser diodes 10a" or "laser diodes 10b" in one figure for indicating arrangement properties, while the same plurality of laser diodes, for instance the laser diode(s) 10a shown in the one figure, can be denoted as "laser diode 10R", "laser diode 10G" and "laser diode 10B" in another figure for indicating color properties of those laser diodes.

FIG. 1 shows in a view 15 an exemplary embodiment of a projector in a projection application. Laser diodes (indicated by an emission plane EP) of a laser device emit a divergent beam through a window 12 of the laser device, wherein the beam is then reflected by reflector 14. Lenses 16 focus the reflected beam onto two orthogonal scanning mirrors 18a, 18b. Alternatively, here and in the following embodiments a single two-axis scanning mirror can also be used. In such case, a single reflecting small mirror replaces the two scanning mirrors 18a and 18b shown in FIG. 1. Moreover, reflector 14 can be omitted so that the laser diodes can emit the produced light directly onto the lenses 16. The focusing beam angle is modified by field-lens 20 before being focused onto micro-lens-array (MLA) 22. The MLA 22 therefore forms a focal plane. A more divergent beam emerging from the MLA 22 is collimated by optics 24 forming a relay-optics before exiting the projector and, for instance, entering a waveguide (not shown) that projects the image onto an observers' eye.

There is an optical path from the laser diodes, represented by emission plane EP, to the MLA 22. The limiting apertures in this optical path are the scanning mirrors, and, particularly, the resonant scanning mirror 18a that is the smallest optical component. Therefore, the superposition of all the beams from the laser diodes should have a minimum beam size at the position of at least one of the mirrors 18a, 18b, should illuminate the mirrors 18a, 18b with minimal "spill-over" (causing power loss) and should focus on the MLA 22, i.e., the focal plane. The minimum beam size of the light beam emitted by the laser device, comprising the light beams of all operated laser diodes, can also be denoted as minimum aperture or, short, as aperture in the following. As mentioned above, all features and embodiments explained before and in the following are also applicable in case that the scanning mirrors 18a and 18b are replaced by a single two-axis scanning mirror.

Figure 2A:
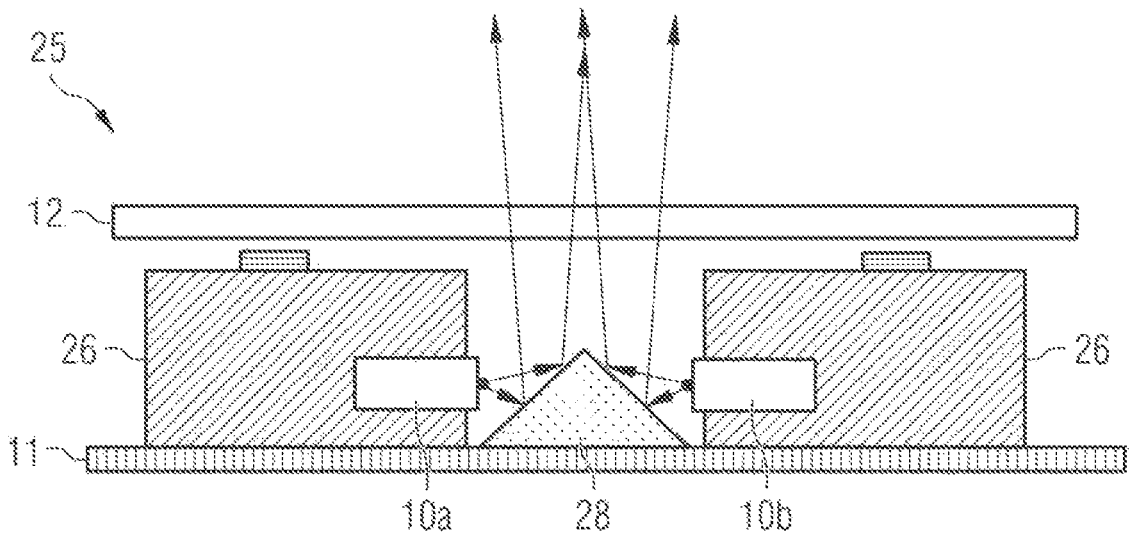
FIGS. 2A to 2D illustrate an example of the placement of laser diodes side-by-side in a laser device in accordance with further embodiments.
Figure 2B:
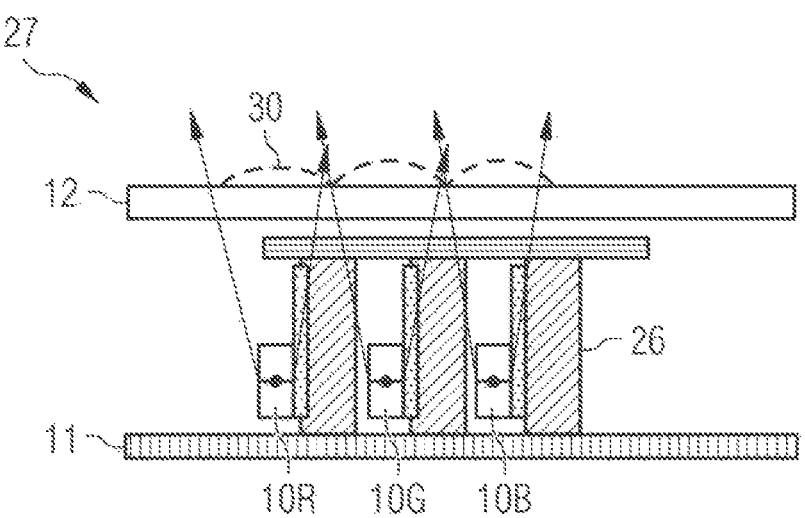

FIGS. 2A and 2B illustrate in a side view 25 and in a front view 27 an exemplary embodiment of a laser device comprising a laser package comprising three laser diode sets, wherein each of the laser diode sets comprises two laser diodes. By way of example, the laser package of the laser device further comprises a base 11, a prism 28 and a window 12. The layout shown in FIG. 2 is only an example and other architectures are possible for the placement and number of the laser diodes as well as for the components of the laser package.

The laser diodes are placed side-by-side in the laser package on the base 11. The laser diodes form two sets of three RGB lasers, on opposing reflecting sides of the prism 28 on the base 11. When operated, each of the laser diodes emits a light beam onto a reflecting side of the prism that reflects the light beams toward the window 12. In the side view 25 only two laser diodes 10a, 10b are visible, wherein the additions "a" and "b" denotes the side of the laser diodes with respect to the prism 28 on the base 11. The three laser diodes 10a on the left-hand side of the prism 28 emit red, green and blue light, respectively, and form one RGB configuration. The three laser diodes 10b on the right-hand side of the prism 28 form another RGB configuration. One of the RGB configurations can be seen in front view 27. In particular, the laser diodes of the shown RGB configuration are denoted as "10R", "10G" and "10B". Each pair of two laser diodes 10a, 10b emitting the same color forms a laser diode set, also denoted as color channel. Furthermore, each of the depicted laser diodes 10a, 10b represents an RGB set comprising a red-emitting laser diode, a green-emitting laser diode and a blue-emitting laser diode. Consequently, in the following it will also be referred to as "laser diode group 10a" and "laser diode group 10b".

As can be seen in the front view 27, each of the laser diodes 10R, 10G, 10B is placed on a submount 26. The submounts 26 may preferably be placed vertically on the base 11 in the laser package. As explained above, this means that the base 11 has a base surface, on which the submounts are arranged and which defines a horizontal plane of the laser package and, thus, of the laser device. The laser diodes are arranged on mounting surfaces of the submounts, wherein the mounting surfaces of the submounts are not parallel to the base surface. Preferably, the mounting surfaces are perpendicular to the base surface. The light emitted from the laser diodes is reflected perpendicularly by prism 28 and passes through the window 12 already indicated in FIG. 1. In other words, the light emitted from the laser diodes and, thus, from the laser package is emitted from the window 12 onto the further optical components described in connection with FIG. 1.

Figure 2C:
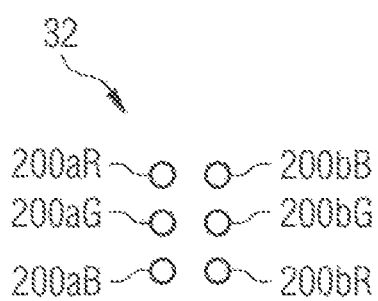
Figure 2D:
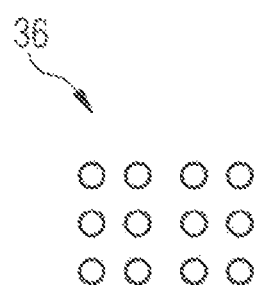

The arrangement of the six laser diodes (three on each side of prism 28) generates a six spot pattern 32 shown in FIG. 2C where every spot must be as sharp as possible to enable a sharp scanned image. Every spot is marked with the reference numeral 200 followed by additions according to the respective color (R, G or B) and the respective RGB set (a or b). Pattern 36 shown in FIG. 2D shows a different pattern that can be generated when two laser diodes are placed on every submount 26. A single RGB set is also possible in which there are only three or four laser diodes (not shown in FIGS. 2A to 2D). In the following, for the sake of clarity, the description of the laser device and the projector will focus on the six-laser configuration as shown in views 25 and 27 and in pattern 32.

Figure 3A:
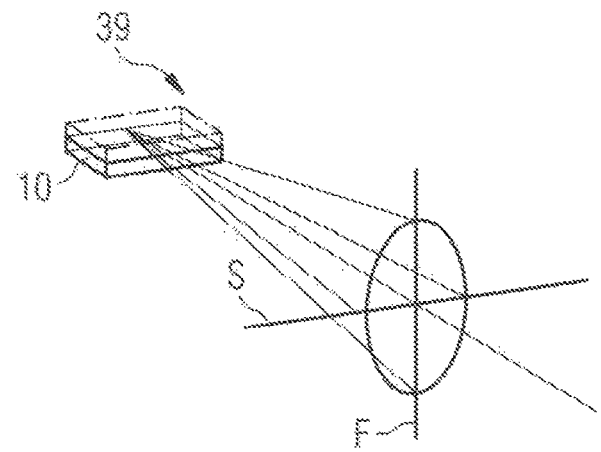
FIGS. 3A to 3D illustrate the beam divergence of a laser device in accordance with further embodiments.

FIGS. 3A to 3D illustrate the beam divergence of a laser device and a modification of the beam divergence in accordance with various implementations. Diagram 39 shown in FIG. 3A shows a diode laser 10 that typically transmits a non-symmetric beam diverging fast on one axis F, the so-called fast axis, and diverging slow on another axis S, the so-called slow axis. This asymmetric beam divergence causes substantial power loss since not all the light can be collected by the projector's optics.

Figure 3B:
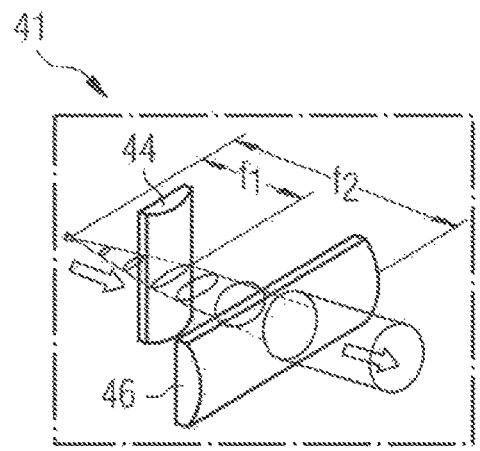
Figure 3C:
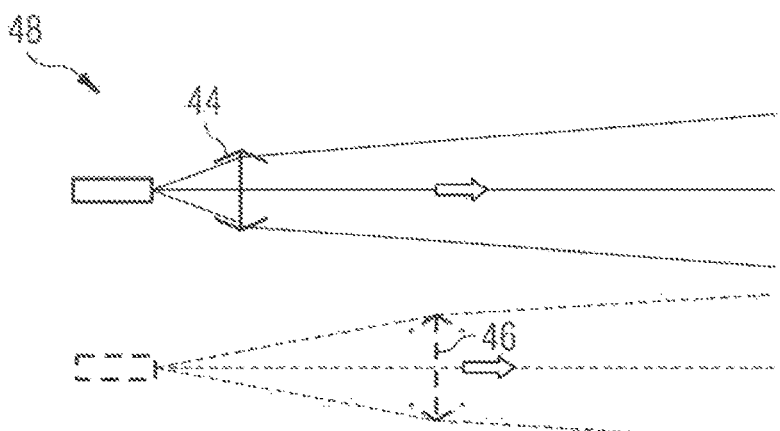

Diagram 41 shown in FIG. 3B shows a method utilizing two cylindrical lenses 44 and 46 for converting the elliptical beam into a circular beam. Diagram 48 shown in FIG. 3C shows the same configuration but with different conventions: the solid lines represent the fast axis rays, i.e., the beam in the fast axis plane, while the dashed lines represent observation from the side where the slow axis is visible, i.e., the beam in the slow axis plane. The lenses 44, 46 are depicted as double headed arrows, only in that view in which they are optically effective. Thus, lens 44, which effects the emitted light only with regard to the fast axis, is only shown in the fast axis plane view, whereas lens 46, which effects the emitted light only with regard to the slow axis, is only shown in the slow axis plane view. In the following figures the same convention of depicting cylindrical lenses is used.

Figure 3D:
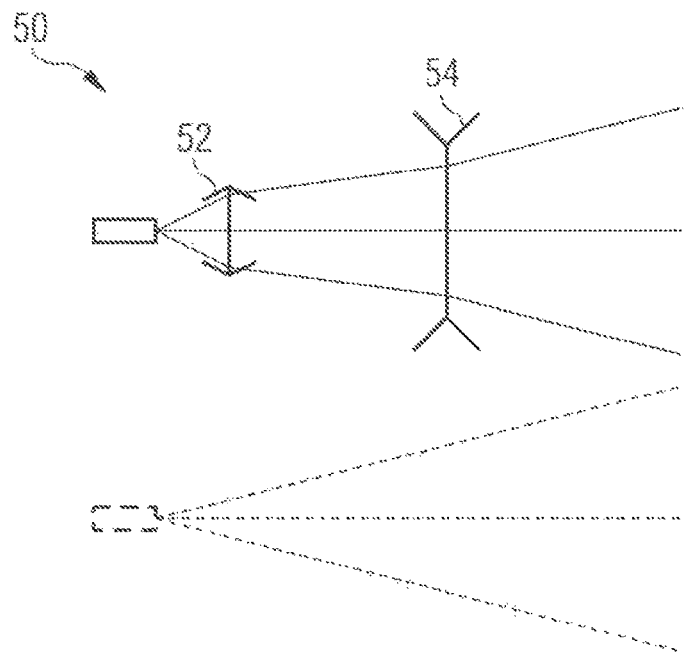

Diagram 50 shown in FIG. 3D show an alternative configuration where both cylindrical lenses are active on the fast axis plane, but wherein one is a convergent lens 52 and the other one is a divergent lens 54. This modifies the fast axis to overlap the slow axis (which is unchanged) in terms of angle and point of origin.

Heron, for clarity, most configurations depicted are equivalent to the configuration according to diagram 50 where only the fast axis is manipulated. However, similar optical arrangements may include the manipulation of both axes as depicted in diagrams 41 and 48, wherein the axis of the second lens is parallel to the slow axis.

FIGS. 4A and 4B illustrate exemplary embodiments for modifying the fast and slow axes of a laser device, i.e., for modifying the light beams emitted by the laser diodes in the fast axis plane and in the slow axis plane, wherein the laser device comprises six laser diodes. Diagram 55 shown in FIG. 4A illustrates schematically how the array of six laser diodes shown in FIGS. 2A to 2D, which have their fast axis planes overlapping, can be modified based on configuration 50 shown in FIG. 3D in order to have circular beams. It is apparent that the distance between the R, G and B laser diodes should be large enough so that their beams do not overlap when being refracted by second lenses 54. However, the two laser diode groups 10a and 10b can be very close. Consequently, prism 28 can be narrow.

Diagram 56 shown in FIG. 4B shows the same six-laser device having both the fast and slow axes modified as implemented in the configurations shown in diagrams 41 and 48 of FIGS. 3B and 3C. Using a single cylindrical lens for the fast axis allows the distance between the R, G and B laser diodes to be closer. However, the presence of lens 46 along the slow axis means that the laser diode groups 10a and 10b must be spaced further apart. The laser diodes' beams have approximately a Gaussian angular distribution. Thus, implementing lenses adjacent to each other will cause leakage of one beam to the lens of a neighboring laser diode, thereby causing crosstalk and degradation of the projected image. Consequently, the laser diodes have to be placed further apart when attempting the depicted beam modification.

FIG. 5 illustrates a system and method for modifying the field of view of both the fast and slow axes of a laser device in accordance with various implementations. Diagram 58 in FIG. 5 shows a set of parallel divergent beams 60 being refracted by an array of lenses 62 to generate a set of parallel less-divergent beams 64. Diagram 65 shows an arrangement that produces the same optical result as the arrangement of diagram 58, except that the set of divergent beams 66 enter a single lens 68, the lens 68 having its optical power on the same plane as the distribution of beams 66 emitted by at least two laser diodes and, preferably, of more than two or even all laser diodes of the laser device. In other words, the lens 68 is assigned to at least two laser diodes and, preferably, to more than two or even all laser diodes of the laser device. That the lens 68 has its optical power on the same plane as the distribution of two or more beams means that the two or more light beams are arranged next to each other in a direction in a first plane and the curvature of the lens lies in a second plane that is the same plane as the distribution of beams, as can be easily seen in diagram 65. In case of a cylindrical lens 68 having a cylinder axis, the first plane, i.e., the plane in which the direction lies along which the beams are arranged next to each other, is perpendicular to the cylinder axis of the cylindrical lens 68.

In order to have the same set of parallel less-divergent beams 64 exit from the single lens 68 as from the array of lenses 62 shown in diagram 58, the beams 66 enter the single lens 68 at tilted angles. Although in FIG. 5 converging lenses 62, 68 are shown, a corresponding effect can be obtained in case of diverging lenses.

Figure 6A:
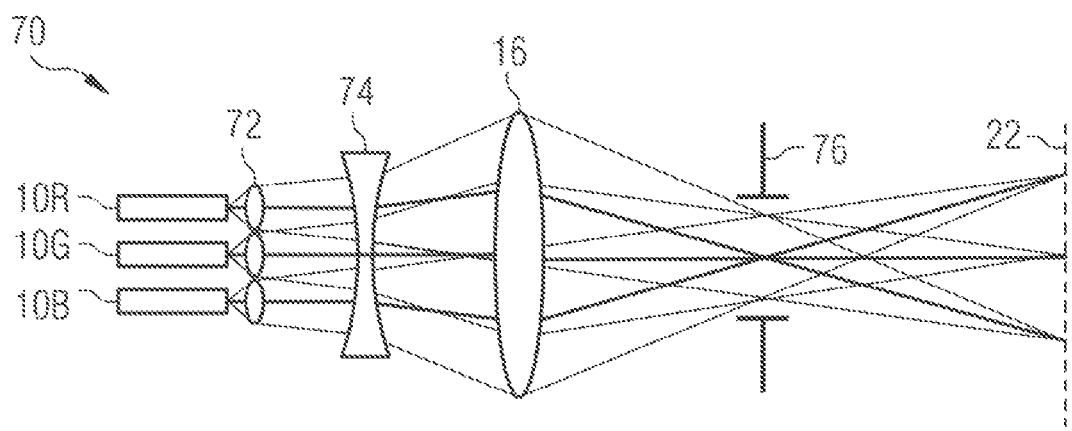
FIGS. 6A to 6E illustrate further embodiments for the correction of differing divergences along the fast axis and the slow axis of a laser device using optics in accordance with various implementations.
Figure 6B:
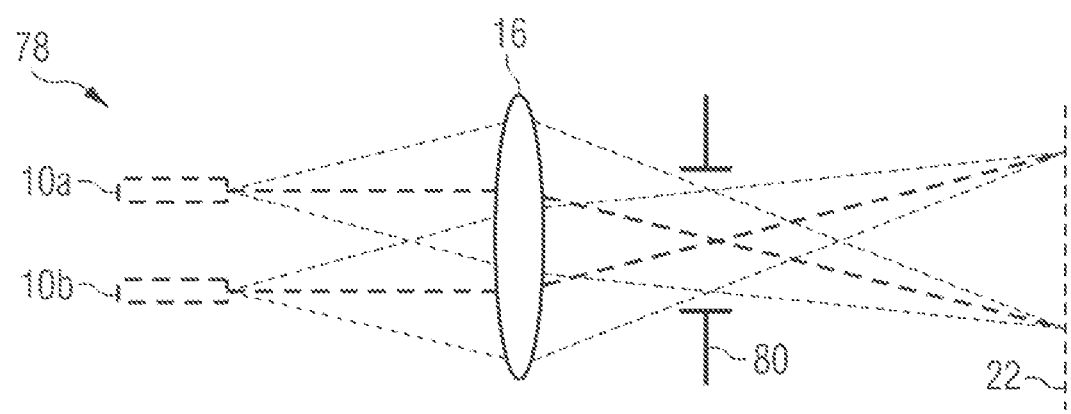
Figure 6C:
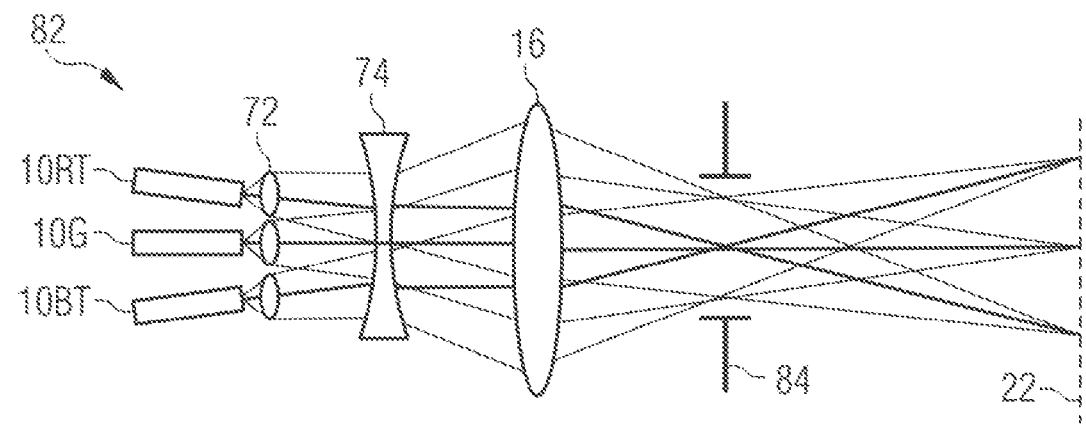

FIGS. 6A to 6C illustrate an embodiment for the correction of differing divergences along the fast axis and the slow axis of a laser device in a projector using optics in accordance with various implementations. Diagram 70 shown in FIG. 6A shows the fast axis orientation with correction. The RBG laser diodes 10 of the laser device emit light onto a convergent optical component, which reduces the fast axis divergence. In the shown embodiment, the convergent optical component is formed by a lens array 72. The lens array 72 comprises convergent cylindrical microlenses arranged next to each other in the plane of the fast axis, wherein the effect of the microlenses is equivalent to the function of the lenses 52 in FIG. 3. Consequently, the cylindrical microlenses each have a cylinder axis that is perpendicular to the fast axis and parallel to the slow axis of the light emitted by the laser diodes. Each of the microlenses is assigned to a laser diode. In contrast to individual lenses, the lens array 72 can be more compact, thereby allowing a more compact design of the laser device.

Preferably, the lens array 72 comprising the microlenses is a part of the laser device and can be arranged, for instance, below or on the window 12. Alternatively, the lens array 72 can form the window 12. It can also be possible that the lens array 72 is a part of the projector and is arranged downstream of the laser device with respect to the beam direction of the light emitted by the laser device.

Downstream of the convergent optical component, i.e., the lens array 72 in the shown embodiment, a further optical component is arranged that is assigned to all laser diodes.

The further optical component is formed by a single divergent cylindrical lens 74 in the shown embodiment. The light beams exiting the lens array 72 enter the single divergent cylindrical lens 74, which has a cylinder axis that is also perpendicular to the fast axis and parallel to the slow axis of the light emitted by the laser diodes. The single divergent cylindrical lens 74 replaces the set of divergent lenses 54 in FIG. 3D. In contrast to individual lenses, the single lens 74 can be more compact, thereby allowing a more compact design of the laser device.

Preferably, the lens 74 can also be a part of the laser device and can be arranged, for instance, below or on the window 12. The lens array 72 and the single lens 74 can be placed on the same side of the window 12 with respect to the beam direction of the light emitted by the laser device, or on different sides of the window. Alternatively, the lens array 72 can form the window 12. It can also be possible that the lens 74 is a part of the projector and is arranged downstream of the laser device with respect to the beam direction of the light emitted by the laser device. Lens 74 can also be a converging lens orientated along the slow axis (equivalent to diagrams 41 and 48 shown in FIGS. 3B and 3C).

Lens 16 of the projector focuses the laser beams emitted from the single lens 74 onto the MLA plane 22. The minimum aperture of the set of beams in the fast axis plane is indicated by reference numeral 76. Preferably, the scanning mirror 18a may be located at this location when the fast axis orientation is taken into account. However, diagram 78 shown in FIG. 6B shows that in the slow axis orientation, which has the same focus plane formed by the MLA plane 22 as diagram 70, the location of the minimum aperture 80 of the set of beams in the slow axis plane is not at the same position as the aperture 76 for the fast axis orientation. Thus, the scanning mirror 18a may preferably be located at this other location when the slow axis orientation is taken into account. Consequently, since the apertures of the six lasers in the slow axis orientation and in the fast axis orientation do not overlap, both possibilities, i.e., placing a scanning mirror either at the position of the aperture 76 with respect to the fast axis of the emitted light or at the position of the aperture 80 with respect to the slow axis of the emitted light, are not perfect with respect to the respective other orientation, so that energy will spill over at the scanning mirror.

Diagram 82 shown in FIG. 6C shows an implementation of the principles described with respect to FIG. 5. The beams of at least one or more of the laser diodes are tilted in the fast axis plane at the output surface of the convergent optical component formed by the lens array 72. This means that the light beams emitted by at least one of the laser diodes exits the convergent optical component in a direction that is not parallel to the optical axis of the convergent optical element. In case of the shown lens array 72 the light beam emitted by at least one of the laser diodes exists the assigned microlens in a direction that is not parallel to the optical axis of that microlens. In particular, the light beams of at least one or more of the laser diodes can also be tilted in the fast axis plane at the input surface of the convergent optical element formed by the lens array 72. In the shown embodiment, the tilting of at least one or more of the light beams is effected by tilting some of the laser diodes (labeled 10RT, 10GT) with respect to each other in the plane of the fast axis as indicated in diagram 82.

A light beam of a laser diode being tilted at the input or output surface of the convergent optical component can mean that the beam direction of the tilted beam deviates from the beam direction of a light beam emitted by another laser diode at the input or output surface of the convergent optical element. In particular, in case of a lens array as shown in FIGS. 6A to 6E, a light beam of a laser diode being tilted can mean that the beam direction of the tilted light beam deviates, at the input or output surface of the lens array, from the optical axis of the assigned microlens of the lens array. A laser diode being tilted can mean that the main emission direction of the light emitted by the tilted laser diode is not parallel to the main emission direction of the light emitted by another laser diode. The main emission direction of a laser diode is the beam direction of the light beam when exiting the laser diode.

As consequence of tilting some of the light beams, for instance by tilting some of the laser diodes, the focal plane given by the MLA plane 22 is maintained at the same location, but the minimum aperture 84 of the set of beams in the fast axis plane can be shifted, for instance closer to the laser diodes. By adjusting the tilting angle of the tilted laser diodes, the shift of the aperture 84 can be optimized so that it overlaps with the slow axis aperture 80 in diagram 78 shown in FIG. 6B. Now, the superposition of all laser diode beams has an overlapping minimum aperture in the fast axis plane and in the slow axis plane and minimum light power is lost, when a scanning mirror is placed at the position of the overlapping aperture.

Figure 6D:
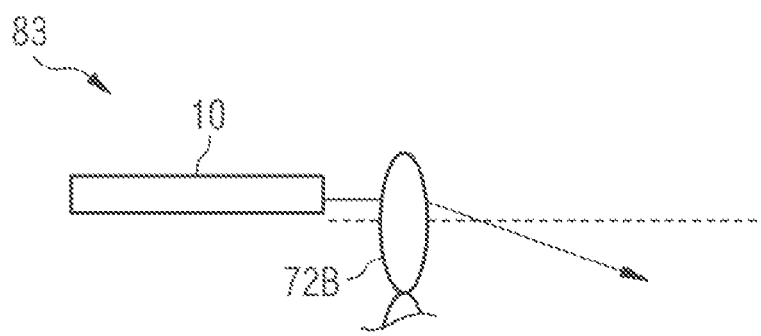
Figure 6E:
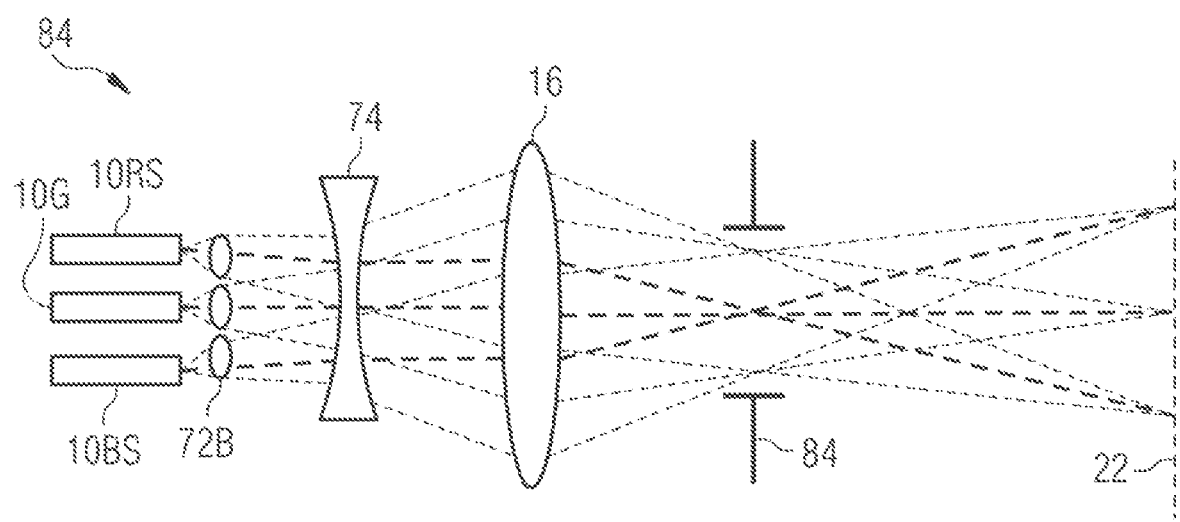

FIGS. 6D and 6E illustrate a further embodiment for the correction of differing divergences along the fast axis and the slow axis of a laser device using optics in accordance with various implementations. As shown in diagram 83 shown in FIG. 6D, the light beam emitted by laser diode 10 enters the microlens of lens array 72B, forming the convergent optical component, off-centered in the fast axis plane with respect to the optical axis (indicated by the dashed line) of the microlens. In the shown embodiment, this is effected by arranging the laser diode 10 off-centered in the fast axis plane with respect to the optical axis of the microlens lens, thereby generating a beam tilt at the output surface of the lens array 72 and thus behind the lens array 72B. This principle is implemented in the laser device of the projector shown in diagram 84 shown in FIG. 6E, where all the lasers (10RS, 10G and 10BS) are arranged parallel with a predefined spacing, while the microlenses of the lens array 72B have a spacing that is slightly smaller. Consequently, the beams from lasers 10BS and 10RS are arranged off-centered and, thus, are tilted to be convergent (equivalent to the effect of tilting the laser diodes 10RT and 10BT in diagram 82 shown in FIG. 6C), while the light beam from laser diode 10G is not off-centered and, thus, continues without tilt. The same approach can be used for different shifts from the center for the laser diodes 10R and 10B depending on the chromatic dispersion or other aberration effects. Also, the spacing of the microlenses can be wider, if diverging beams are needed. The chromatic aberration can be compensated if the microlenses of lens array 72/72B have different optical powers.

Figure 7A:
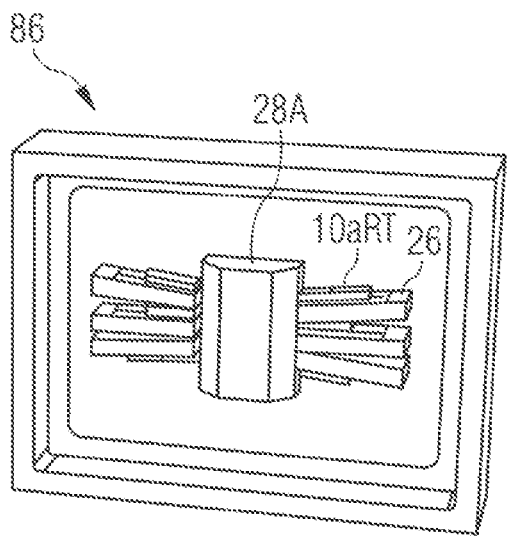
FIGS. 7A to 7D illustrate examples of implementing a laser beam tilt in a laser device in accordance with further embodiments.

FIGS. 7A to 7D illustrate exemplary embodiments of implementing the described light beam tilt in a laser device in accordance with various implementations. Diagram 86 shown in FIG. 7A shows a placement of the lasers and submounts 26 at differing relative angles with respect to the central parallel prism 28A. For the sake of clarity, only laser diode 10aRT, corresponding to laser diode 10RT shown in FIG. 6A, is labelled.

Figure 7B:
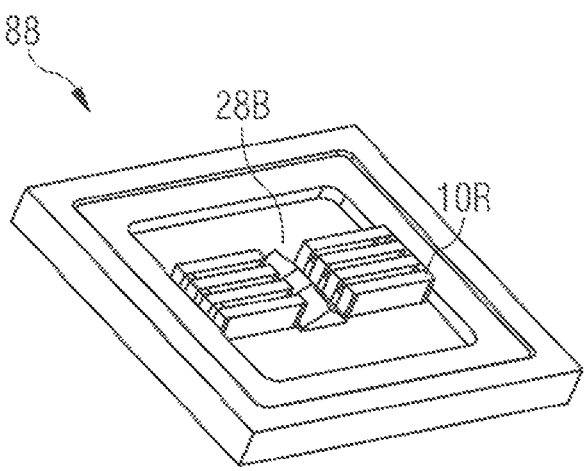
Figure 7C:
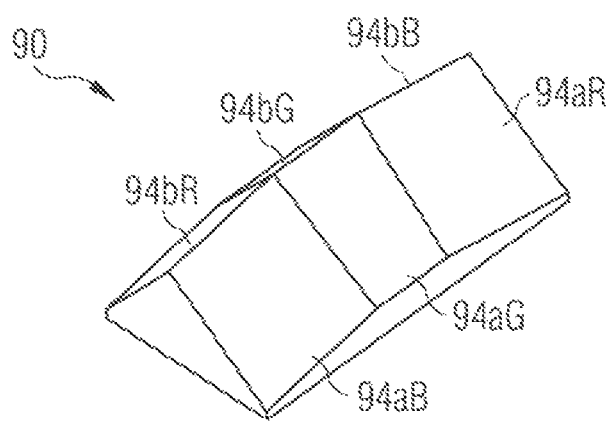

Diagram 88 shown in FIG. 7B shows a parallel placement of the laser diodes while the prism 28B has modified faces reflecting the light from every laser diode at the desired respective correct (tilted or non-tilted) angle. Diagram 90 shown in FIG. 7C is a close-up view of prism 28B. As can be seen, the prism 28B has two reflecting sides, onto which the laser diodes emit light, wherein on each side there are several faces 94aB, 94aG, 94aR, 94bR, 94bG, 94bB that are tilted with respect to each other. The faces 94aB, 94aG, 94aR, 94bR, 94bG, 94bB of prism 28B are marked according to the assigned laser diodes by color (R, G and B) and side (a and b).

Figure 7D:
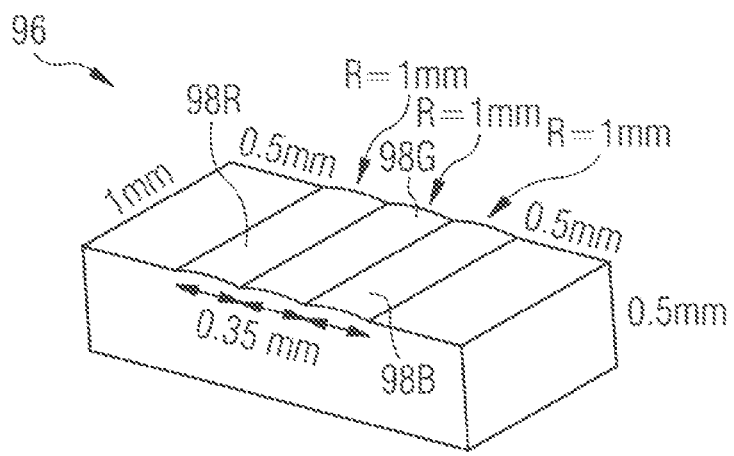

Diagram 96 shown in FIG. 7D shows an example with exemplary dimensions of elements 98R, 98G, 98B for a lens array 72 described in connection with FIGS. 6A to 6C that may be placed adjacent to window 12, for instance as described in connection with FIGS. 2A and 2B, or embedded in it. In this preferred configuration of the array, every cylindrical array acts simultaneously on two opposing laser diodes from both sides of the prism.

Figure 8A:
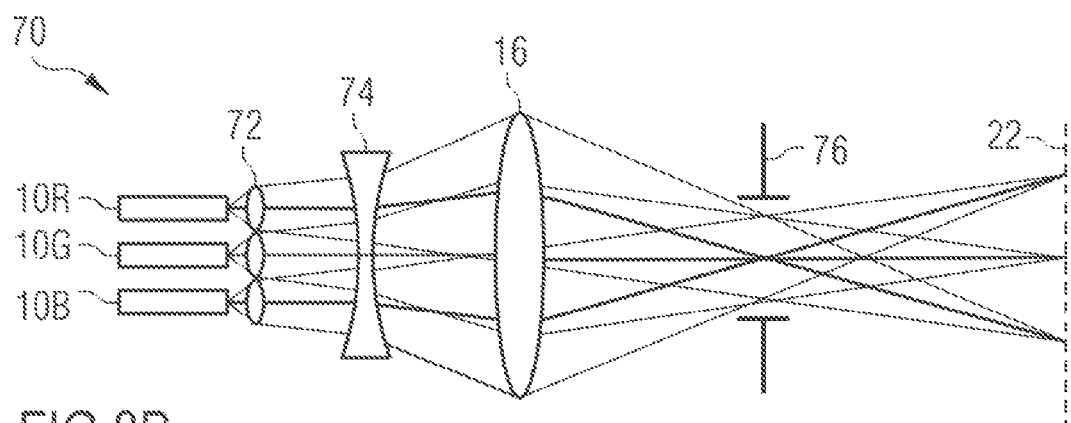
FIGS. 8A and 8B illustrate a further embodiment for the correction of differing divergences along the fast axis and the slow axis of a laser device using optics in accordance with various implementations.
Figure 8B:
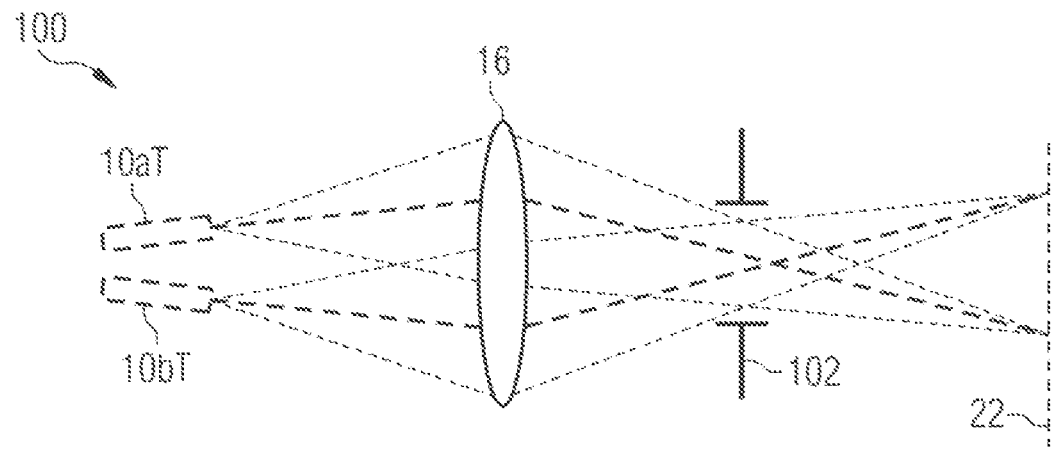

FIGS. 8A and 8B illustrate a further embodiment for the correction of differing divergences along the fast axis and the slow axis of a laser device using optics in accordance with various implementations. FIG. 8A shows a reproduction of diagram 70 of FIG. 6A and FIG. 8B a new diagram 100 that shows two laser diode groups 10aT, 10bT that are tilted with respect to each other in the slow axis plane. The two laser groups 10aT, 10bT are tilted so that the aperture 102 in the slow axis plane, i.e., the apertures of laser diode groups 10a and 10b, overlap with the aperture 76 in the fast axis plane (R, G, B in every group) of FIG. 6A. Therefore, all six lasers' apertures are overlapping.

FIGS. 9A and 9B illustrate a further embodiment for the correction of differing divergences along the fast axis and the slow axis of a laser device using optics in accordance with various implementations. In diagram 104 shown in FIG. 9A, the laser diodes (only the visible laser diodes 10aRW and 10bBW are labeled) are tilted on the submount 26 with respect to a horizontal plane defined by a base, for instance base 11 shown in FIGS. 2A and 2B, on which the submounts 26 are mounted. In this way the light beams hit the prism 28 (a or b) at specified angles and are reflected at specified angles. Alternatively, as shown in diagram 106 shown in FIG. 9B, also a configuration is possible where the prism's 28 reflecting surfaces include at the top of the prism 28 an angle that deviates from 90°, so that the reflected beams receive the desired angles, whereas the laser diodes can be mounted horizontally, i.e., to emit in a horizontal direction.

Figure 10A:
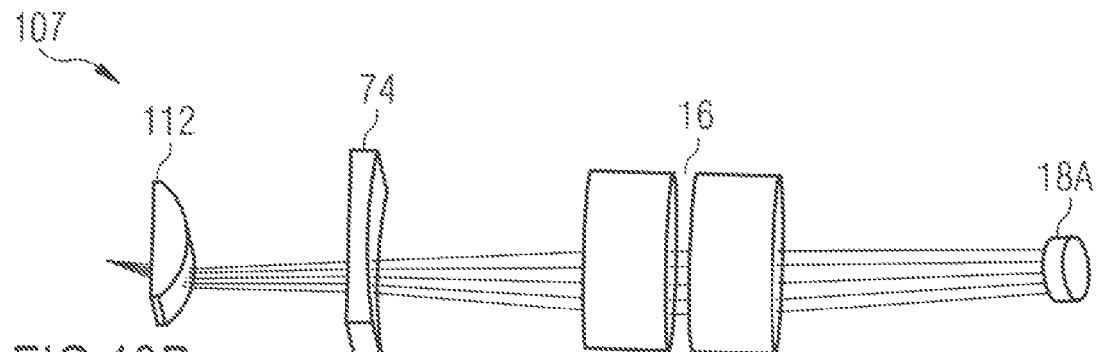
FIGS. 10A to 10D illustrate a further embodiment for modifying the field of view of both the fast and slow axes of a laser device in accordance with various implementations.
Figure 10B:
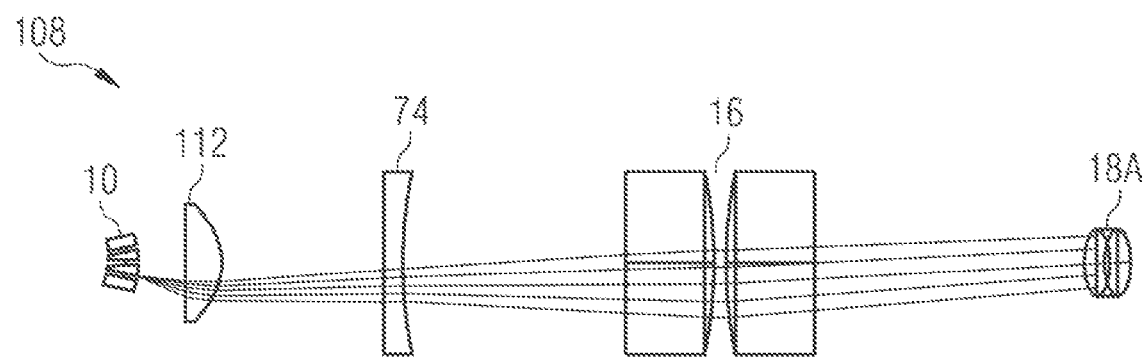
Figure 10C:
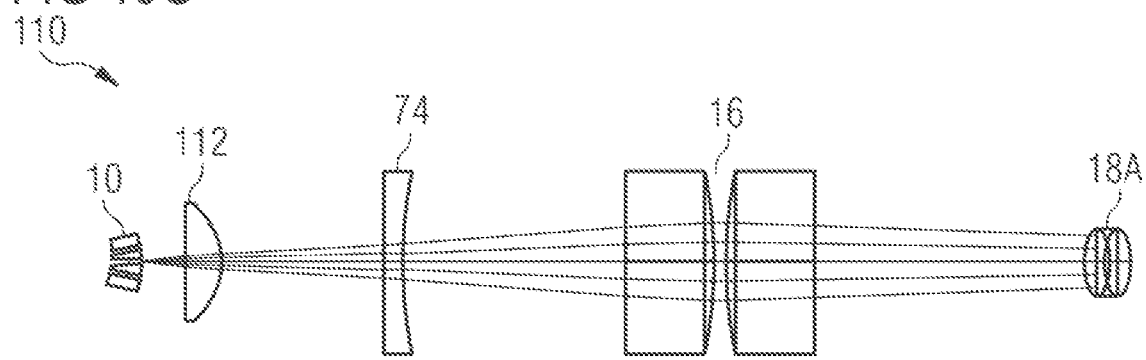
Figure 10D:
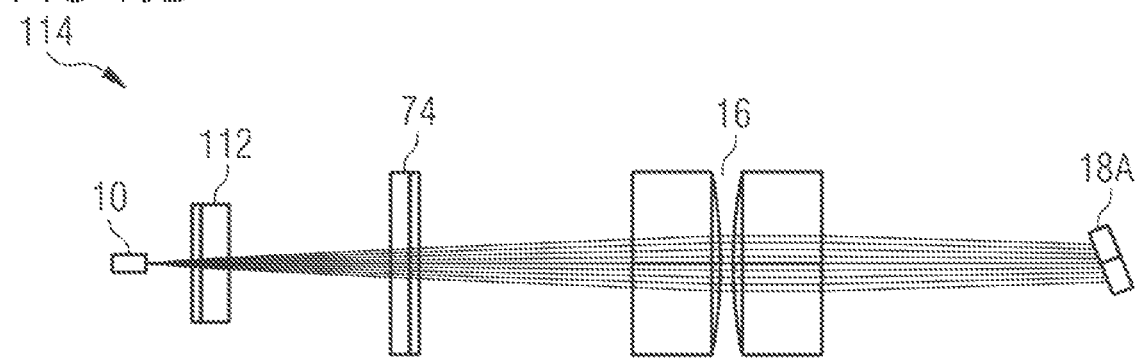

FIGS. 10A to 10C illustrate a further embodiment for the correction of differing divergences along the fast axis and the slow axis of a laser device using optics in accordance with various implementations. In comparison to the embodiments described before, the lens array 72 as described before is replaced by a single convergent cylindrical lens 112 that covers all lasers beams as described in FIG. 5. Diagram 107 shown in FIG. 10A shows a three-dimensional schematic illustration of lenses 112, 74 and 16 and scanning mirror 18A. Diagram 108 shown in FIG. 10B shows in the fast axis plane light beams emerging from one of the laser diodes 10B or 10R placed on the outer side through cylindrical lens 112 (preferably serves as laser window 12) and a second divergent lens 74, for instance a divergent lens as shown in FIGS. 6A to 6C, where the laser diodes' tilt compensates for both lenses 112 and 74 according to the principles described in connection with FIG. 5. Diagram 110 shown in FIG. 10C shows, for reference, the central laser diodes' light beams co-illuminating the same scanning mirror 18A. Diagram 114 shown in FIG. 10D shows the slow axis orientation, in which light in this plane is refracted only by conventional lenses 16. The ellipticity of the beam in this example was reduced from 1:3.5 to an acceptable ellipticity of 1:1.5.

The configurations shown in FIGS. 10A to 10D include a laser device with a 3-laser package with three laser diodes located in a same plane (shown as a single beam in diagram 114). However, another array of lasers (such as six as shown in diagram 32 or twelve shown in diagram 36) may also be implemented, in which an additional vertical tilt (as shown in FIG. 9) may be implemented if needed.

In some implementations, the laser diodes may be oriented perpendicularly so that the slow axis plane is overlapping (instead of the fast axis). In this case, the same arrangements of tilt are applicable, with the lenses at orthogonal orientations.

Figure 11A:
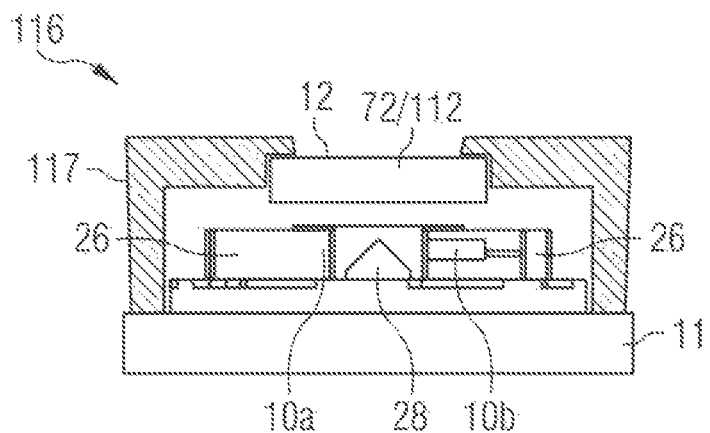
FIGS. 11A to 11D illustrate laser devices according to further embodiments.
Figure 11B:
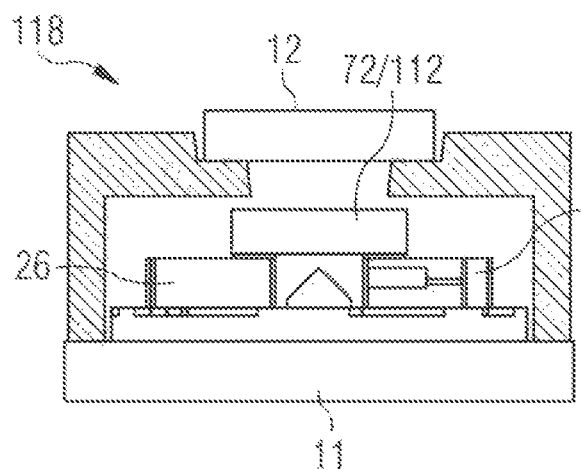
Figure 11C:
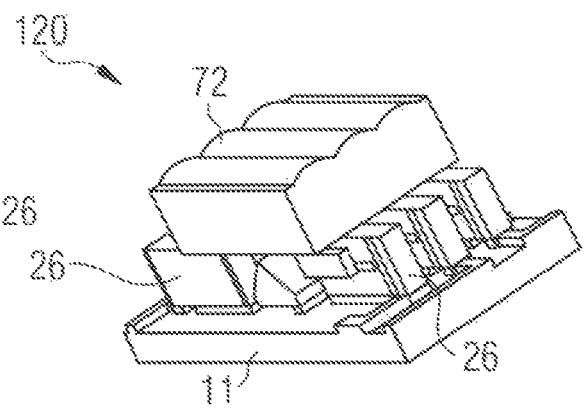
Figure 11D:
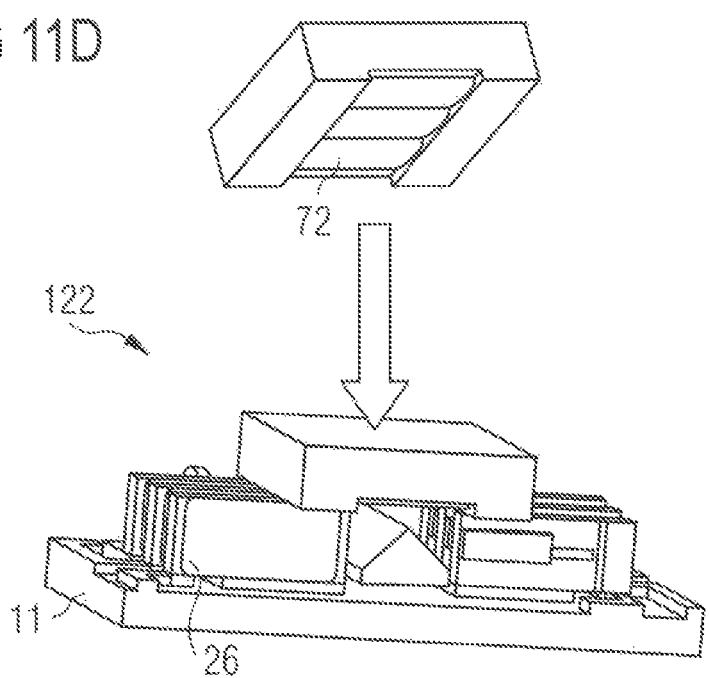

The distance and the lateral placement of the lens arrays 72, 72B or of single lens 112 is of great importance since misalignment can cause substantial defocusing or undesired beam shifts. FIGS. 11A to 11D show embodiments for the placement of the lens array/single lens (labelled "72/112") in the laser package of the laser device. In diagram 116 shown in FIG. 11A the lens array/single lens are combined with window 12. In other words, the lens array/single lens forms the window through which the light emitted by the laser diodes exits the laser package. Frame 117 holds the lens array/single lens, thereby enabling optical power and sealing of the laser chamber of the laser package. In diagram 118 shown in FIG. 11B the lens array/single lens is placed directly on the submounts 26, thereby enabling a shorter optical path from the laser diodes and enabling a more accurate positioning. Diagrams 120 and 122 shown in FIGS. 11C and 11D show the placement of the lens array/single lens facing upward or downward, respectively, on top of the submounts. A similar placement is possible where the lens array/single lens is placed on a mount (not shown) similar to submounts 26, but placed next to submounts 26, thereby enabling a stronger support while having the same accuracy since the lens array/single lens is positioned on the same base 11 as the submounts 26.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

The features and embodiments described in connection with the figures can also be combined with one another according to further embodiments, even if not all such combinations are explicitly described. Furthermore, the embodiments described in connection with the figures can have additional and/or alternative features according to the description in the general part.

The foregoing description of the implementations of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

We claim:

1. A laser device, comprising:
   a laser package comprising a plurality of laser diodes, each laser diode emitting a light beam having a fast axis and a slow axis and a beam direction, wherein the light beams of all laser diodes of the laser package are emitted from the laser package as a pattern; and
   one or more optical components configured to modify a divergence of the light beams in a fast axis plane and/or in a slow axis plane such that the light beams have a same focal plane in the fast axis plane and in the slow axis plane, wherein the laser diodes are mounted on one or more submounts, wherein the one or more submounts are arranged vertically on a base, wherein the one or more optical components comprise at least one cylindrical lens and a lens array, wherein the at least one cylindrical lens is assigned to at least two laser diodes, wherein the lens array comprises a plurality of convergent cylindrical microlenses arranged next to each other along a direction in the fast axis plane, wherein for the pattern of the light beams emitted from the laser package a minimum aperture in the fast axis plane and a minimum aperture in the slow axis plane overlap, wherein the minimum aperture in the fast axis plane denotes, along the fast axis, a minimum beam size of a superposition of the light beams of all laser diodes and the minimum aperture in the slow axis plane denotes, along the slow axis, a minimum beam size of a superposition of the light beams of all laser diodes, and wherein, at an output surface of the lens array, the light beam of at least one laser diode is tilted in the fast axis plane with respect to the light beam of another of the laser diodes at the output surface of the lens array and/or with respect to an optical axis of the assigned microlens.

2. The laser device of claim 1, wherein at least one optical component is directly placed on the one or more submounts.

3. The laser device of claim 2, wherein the one or more submounts are arranged, along the vertical direction, between the base and the at least one optical component that is directly placed on the one or more submounts.

4. The laser device of claim 1, wherein at least one optical component forms a window of the laser package.

5. The laser device of claim 1, wherein the at least one cylindrical lens that is assigned to at least two laser diodes is a single cylindrical lens that is assigned to all laser diodes.

6. The laser device of claim 1, wherein the one or more optical components comprise a convergent optical component influencing only a beam divergence in the fast axis plane.

7. The laser device of claim 1,
wherein each of the microlenses is assigned to at least one laser diode,
wherein each of the microlenses has a cylinder axis that is perpendicular to the fast axis and parallel to the slow axis.

8. The laser device of claim 1, wherein at least some of the laser diodes are tilted with respect to each other in the fast axis plane.

9. The laser device of claim 1, wherein at least one laser diode is arranged off-centered in the fast axis plane with respect to the optical axis of the assigned microlens.

10. The laser device of claim 1, wherein the lens array comprises a plurality of microlenses that have different optical powers.

11. The laser device of claim 1, wherein at least some of the laser diodes are tilted with respect to each other in the slow axis plane.

12. The laser device of claim 1, wherein the one or more optical components comprise a divergent optical component influencing only a beam divergence in the slow axis plane.

13. The laser device of claim 1, wherein the one or more optical components comprise a divergent cylindrical lens assigned to all laser diodes.

14. The laser device of claim 1, wherein one or more of the plurality of laser diodes are tilted at an angle from an axis of symmetry of the one or more optical components.

15. The laser device of claim 1, further comprising a prism having two reflecting sides, onto which the laser diodes emit light, wherein on each side there are several faces that are tilted with respect to each other.

16. The laser device of claim 1,
wherein at least two laser diodes emit light beams that are arranged next to each other in a direction in a first plane,
wherein the one or more optical components comprises a lens that is assigned to the at least two laser diodes and that has a curvature that lies is a second plane that is the same plane as the first plane.

17. The laser device of claim 16, wherein the lens is a cylindrical lens having a cylinder axis, wherein the cylinder axis is perpendicular to the first plane.

18. A projector comprising a laser device and a scanning mirror,
wherein the laser device comprises:
a laser package comprising a plurality of laser diodes, each laser diode emitting a light beam having a fast axis and a slow axis and a beam direction, wherein the light beams of all laser diodes of the laser package are emitted from the laser package as a pattern of at least 2×2 light beams; and
one or more optical components configured to modify a divergence of the light beams in a fast axis plane and/or in a slow axis plane such that the light beams have a same focal plane in the fast axis plane and in the slow axis plane,
wherein the laser diodes are mounted on one or more submounts,
wherein the one or more submounts are arranged vertically on a base,
wherein the one or more optical components comprise at least one cylindrical lens and a lens array,
wherein the at least one cylindrical lens of the one or more optical components is assigned to all laser diodes of the laser device,
wherein the lens array comprises a plurality of cylindrical microlenses,
wherein for the pattern of the at least 2×2 light beams emitted from the laser package a minimum aperture in the fast axis plane and a minimum aperture in the slow axis plane overlap,
wherein the minimum aperture in the fast axis plane denotes, along the fast axis, a minimum beam size of a superposition of the light beams of all laser diodes and the minimum aperture in the slow axis plane denotes, along the slow axis, a minimum beam size of a superposition of the light beams of all laser diodes, and
wherein the scanning mirror is placed at the position of the overlapping apertures.

19. A laser device, comprising:
a laser package comprising a plurality of laser diodes, each laser diode emitting a light beam having a fast axis and a slow axis and a beam direction, wherein the light beams of all laser diodes of the laser package are emitted from the laser package as a pattern; and
one or more optical components configured to modify a divergence of the light beams in a fast axis plane and/or in a slow axis plane such that the light beams have a same focal plane in the fast axis plane and in the slow axis plane, wherein the laser diodes are mounted on one or more submounts, wherein the one or more submounts are arranged vertically on a base, wherein the laser diodes and submounts are placed at different relative angles with respect to a central parallel prism, wherein the one or more optical components comprise two cylindrical lenses or at least one cylindrical lens and a lens array, wherein at least one cylindrical lens of the one or more optical components is assigned to at least two laser diodes, wherein for the pattern of the light beams emitted from the laser package a minimum aperture in the fast axis plane and a minimum aperture in the slow axis plane overlap, and wherein the minimum aperture in the fast axis plane denotes, along the fast axis, a minimum beam size of a superposition of the light beams of all laser diodes and the minimum aperture in the slow axis plane denotes, along the slow axis, a minimum beam size of a superposition of the light beams of all laser diodes.

* * * * *